US00RE37138E

(19) United States
(12) Reissued Patent
Dent

(10) Patent Number: US RE37,138 E
(45) Date of Reissued Patent: Apr. 17, 2001

(54) LOG-POLAR SIGNAL PROCESSING

(75) Inventor: Paul Wilkinson Dent, Stehag (SE)

(73) Assignee: Telefonaktiebolaget LM Ericsson, Stockholm (SE)

(21) Appl. No.: 08/102,951

(22) Filed: Aug. 6, 1993

Related U.S. Patent Documents

Reissue of:
(64) Patent No.: 5,048,059
Issued: Sep. 10, 1991
Appl. No.: 07/408,379
Filed: Sep. 18, 1989

(30) Foreign Application Priority Data

Sep. 19, 1988 (SE) ..... 8803313

(51) Int. Cl.[7] ..... H04B 1/10
(52) U.S. Cl. ..... 375/340; 327/351; 375/349
(58) Field of Search ..... 375/42, 75, 94, 375/102, 269, 316, 340, 348, 349; 455/210, 211, 241.1, 308, 341; 307/492; 328/145; 342/91, 92, 194, 203, 204; 364/484, 715.03, 731, 857; 327/350, 351, 352

(56) References Cited

U.S. PATENT DOCUMENTS

| | | | | |
|---|---|---|---|---|
| 3,496,298 | * | 2/1970 | Crookshanks et al. | 375/42 |
| 3,668,535 | * | 6/1972 | Lansdowne | 328/145 |
| 3,849,595 | * | 11/1974 | Ishiguro | 375/42 |
| 4,492,930 | * | 1/1985 | Knowles et al. | 328/145 |
| 5,001,776 | * | 3/1991 | Clark | 455/308 |

FOREIGN PATENT DOCUMENTS

07178146 * 7/1985 (SE) .

OTHER PUBLICATIONS

The article by W. L. Barber et al., "A True Logarithmic Amplifier for Radar IF Applications", *IEEE Journal of Solid–State Circuits,* vol. SC–15, No. 3, Jun. 1980.*

* cited by examiner

*Primary Examiner*—Dang Ton
(74) *Attorney, Agent, or Firm*—Burns, Doane, Swecker & Mathis, L.L.P.

(57) ABSTRACT

The invention relates to a method and an arrangement intended for radio communication systems and effective in digitalizing and subsequently processing numerically arbitrary radio signals. The signals are represented by composite (complex) vectors which have been subjected to disturbances in the system, such that information in the signals has been lost. This information is restored in its entirety when practising the present invention. For the purpose of solving this problem, the inventive digitalizing arrangement includes a multistage logarithmic amplifier chain (A) in which each stage is connected to a separate detector (D), the output signals of which are added in an adder. The adder output signals are then transmitted to a first A/D-converter (AD1) for digitalizing and converting the amplitude components of the signal. At the same time, the undetected signal from the saturated output stage in the amplifier chain is transmitted to a second A/D-converter for digitalizing and converting the phase components of the signal. The digital values obtained on the outputs of the AD-converters (AD1, AD2) are applied to different inputs of a digital signal processor (MP) for numerical processing of the pairwise received digital values in a manner such as to restore the complete vector characteristic of the signal.

32 Claims, 2 Drawing Sheets

"AMENDED"

"AMENDED"

LOG-POLAR SIGNAL PROCESSING

Matter enclosed in heavy brackets [ ] appears in the original patent but forms no part of this reissue specification; matter printed in italics indicates the additions made by reissue.

TECHNICAL FIELD

The invention relates to an improved method and arrangement of apparatus for digitalizing and subsequently processing numerically radio signals in those instances when the levels of said signal can vary over a wide dynamic range and where the level values cannot be readily determined beforehand with the aid of sampling techniques.

BACKGROUND ART

It is always possible to represent an arbitrary radio signal as a sequence of composite (complex) vectors. The real and imaginary parts of the vector sequence correspond to bipolar amplitude modulation (double side band suppressed carrier AM) of a cosinusoidal and sinuosidal carrier wave respectively (quadrature carriers). When wishing to process a radio signal numerically using digital arithmetic implemented in either specific hardware logic or in software on a computer, microprocessor or some other programmable apparatus, it is first necessary to convert the signal in to numerical form with the aid of a A/D-converter (Analogue to Digital converter).

One common method of achieving this is to first resolve the radio signal into its real and imaginary complex vector part, by correlation with locally generated cosine and sine waves in two balanced mixers, and then to digitalize the two results by means of A/D-conversion. Sometimes there is used a variation of this technique, in which the radio signal is sampled pairwise, separated by one quarter period of its centre frequency. This so-called quadrature sampling technique combines the functions of sampling and A/D-conversion with resolution in real and imaginary parts.

DISCLOSURE OF INVENTION

The aforesaid, known solutions have practical limitations with respect to the possibilities of handling the dynamic ranges of the signals. Despite the absence of an input signal, the arrangement used in accordance with the first method, in which balanced mixers are used as correlators, does not necessarily produce a zero (0) volts, output signal. The output signal will typically have a D.C. off-set of some few millivolts or some tens of millivolts. At the same time, the acceptable, maximum signal level of the available supply voltage is limited to, for instance, +2.5 volts or, in the case of diode-ring mixers, perhaps to a still lower level of, for instance, +250 mV. The dynamic range for which the signal is, on one hand, much higher than the D.C. offset (mixer imbalance) and, on the other hand, lower than the saturation level, may be as small as 20 dB (decibel). This then requires the introduction of some form of automatic amplification control, in order to maintain the signal level of the mixer in the optimum range. In the case of a receiver which must necessarily accept random transmission of data in the form of bursts from different transmitters, it is not possible, however, to predict the level of amplification required, when applying this method.

A further drawback, applicable to both of the aforesaid methods, resides in limited resolution during the A/D-conversion process. Assume that an A/D-converter is able to represent the whole of the signal level range. Further assume that the highest signal level may be equal to the supply voltage, e.g. 5 volts. An LSB-bit (Least Significant Bit) then corresponds to 5/256 volts, i.e. approximately 20 millivolt. Consequently, a signal beneath 20 mV will remain totally undiscovered, while a signal of 320 mV will only be digitalized to a resolution of 4 bits, which is perhaps insufficient for subsequent signal processing. If a 4 bit resolution is nevertheless acceptable, the range in which the signals can be processed will be 16:1 or 24 dB, which is a very poor dynamic range in the case of radio applications.

Radar receivers are typical examples of systems in which it is impractical to use automatic amplification control for the purpose of maintaining the receiver output within narrow limits, this impracticability being due to a number of unknown parameters, for instance such parameters as the distance to the reflecting object, the size of said object and the duration of the pulse. Because of this a radar receiver will normally operate with a chain of intermediate frequency amplifiers known as "logarithmic amplifiers". Such an arrangement comprises a plurality of sequentially saturating, cascade-connected amplifiers each being provided with an amplitude detector rectifier) whose output signals are intended to be added together. The arrangement functions in the following manner: In the case of the weakest input signal levels, it is solely the detector which is located at the end of the chain which will receive a signal whose level of amplification is sufficient for the detector itself to produce an output signal. This ability increases with increasing input signal levels, until the amplifying stage concerned is saturated. At this stage, and with correct selection of amplification for each amplifying stage, the preceding amplifying stage in the chain will begin to receive a signal which is sufficiently strong for detection purposes and therewith takes over the contribution to the output signal. For each X dB increase in input signal level, where X is 20 log 10 of the voltage amplification in each stage, the saturation point is moved rearwardly one stage in the chain, the net detected output signal therewith increasing by one unit. The net detected output signal is thus followed by an approximately rectilinear relationship with the logarithm on the input signal level. The dynamic range for which this coincides is limited solely by the number of amplifying stages and the thermal noise. The method of digitalizing the detected output signal for subsequent numeric processing of the signal in an arrangement according to the aforegoing is insufficient when handling arbitrary radio signals, since the complex vector nature of the arbitrary radio signal will be lost in such a sequential detecting process.

The method and arrangement solving said problems are characterized by the patent claims and involve the introduction of a further digitalizing process which operates on the saturated output of the last amplifying stage in an amplifier chain in accordance with the aforegoing, extracting the vector information which otherwise would be lost. This procedure is followed by a multiple of numeric operations on the two digital quantities, in order to restore the complete vector characteristic of the signal. This can be effected with the aid of hardware logic or with programmable digital signal processors (microprocessors). The inventive digitalizing arrangement, intended for processing composite signals having a large dynamic range, thus includes a logarithmic amplifying chain similar to the kind used in radar receivers and in which the detected output signal from the amplifier is digitalized in a first A/D-converter, whereafter a second A/D-converter digitalizes the angle or phase information of the signal. The phase information is retained by utilizing a carefully configured chain of saturating amplifiers, and is available on the saturated output of the last amplifier stage, at which point the signal has obtained a constant level and all variations in amplitude have therewith been eliminated. The exact method in which phase information is extracted in the form of a numeric quantity is not an objective of the present invention and [will therefore not be] *only a representative example will be* described in this document.

The advantages afforded by the inventive method and inventive arrangement reside in the solution of a troublesome problem within the field of radio communications, in a technically uncomplicated manner, therewith achieving high precision at low costs.

BRIEF DESCRIPTION OF DRAWING

An arrangement according to the invention will now be described in more detail with reference to an exemplifying embodiment thereof illustrated in the accompanying drawing, in which.

BEST MODE FOR CARRYING OUT THE INVENTION

Described in the following is a novel method of digitalizing composite signals and an arrangement for carrying out the method. A complex number can be expressed either in cartesian (x,y) form or in polar (R, THETA) form. Translation between these two forms can be effected readily with the aid of the equations X=R cos (THETA); Y=R sin (THETA).

The log polar form (r, THETA) in which r=log (R) can be advantageously used as an alternative to the two forms aforesaid. The following transformation will then apply: (x,y)=exp(r+j THETA); (rl, THETA)=log(x,y).

These equations show that when having a value on the logarithm of the amplitude of the complex vector (r) and a value on the angle (THETA) of the complex vector, it is possible to restore the cartesian components of the complex vector when so desired.

Figure 1:
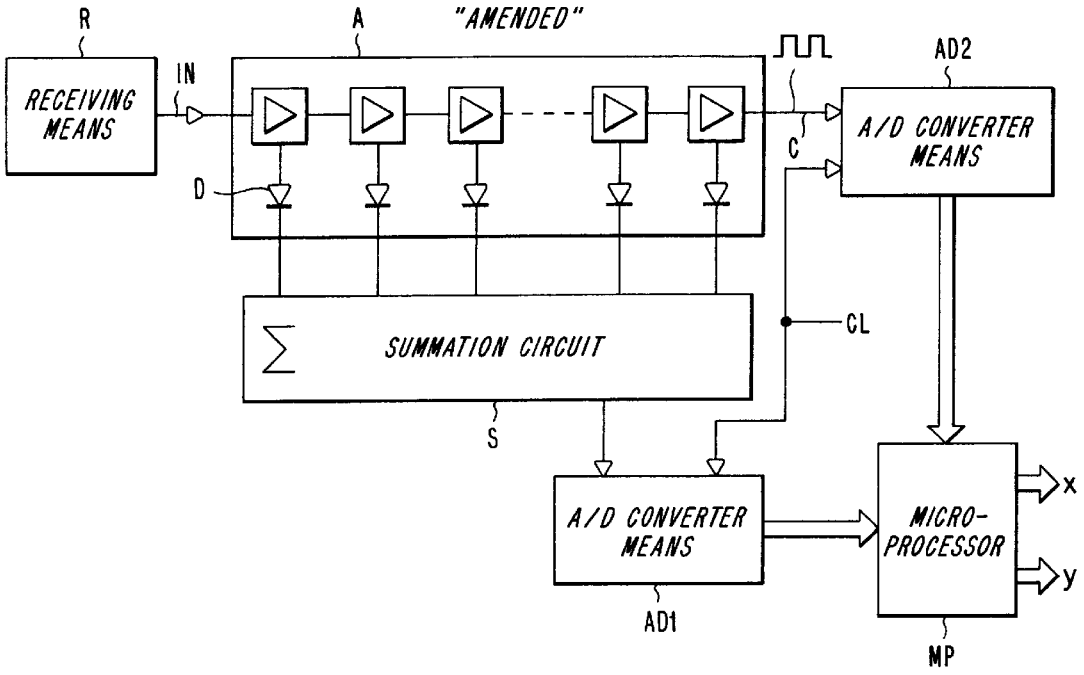
FIG. 1 is a block schematic of the inventive arrangement.

The inventive digitalizing arrangement for complex signals having wide dynamic ranges utilizes the principle illustrated in FIG. 1. The signal to be processed is converted to an appropriate intermediate frequency *by receiving means R* and then applied to the input IN of the first amplifier of an amplifier chain A. Said chain including a number of progressively detecting amplifiers.

Suitable, logarithmic amplifiers are available on the market, in the form of integrated circuits. Each stage of the aforesaid amplifier chain consists of one such circuit of the type SL521 A (Plessey Semiconductors). It is also possible to incorporate all amplifying stages in one single circuit, for instance a Signetics SA 604 circuit.

Connected to each of the output of respective amplifying stages is a detector (a rectifier) which has the form of a diode circuit and which is individual to respective stages. The detector outputs are all connected to a summation circuit S of type LF 157 A (National Semiconductors), in which the values from each detector circuit are summated and produced in the form of a summated signal of the output of the summation circuit. This output is connected to an input of a first rapid analogue/digital converter AD1, for instance a converter of type MP 7683 (Micropower Systems). The LOG-amplitude, quantized to N bits, is produced on the outputs of the A/D-converter and delivered to a first number of inputs of a digital signal processor MP. N must be large enough to cover the desired dynamic range in increments or steps which are sufficiently small for the application concerned. For example, if a signal variation range of 128 dB is to be covered and N=8 bits, the size of the quantizing step will be 128/256=0.5 dB. Said steps size must be small enough to reduce the quantization noise to a level adapted to the application concerned. Quantization is a known technique which lies outside the concept of the present invention and which will not therefore be described in detail in this document.

The signal produced on an output C of the amplifying chain is so strongly amplified it appears hardlimited (clipped), i.e. the amplifiers are so amplified that the signal is converted into a two-level signal, a square-wave of alternating high or low level. This signal retains the phase-angle information of the original signal when timing the transitions between the two signal levels. The exact method in which phase angle information is extracted in numeric form constitutes no [part] *limitation* of this invention, but can for instance be effected with the aid of an appropriate phase detector which is operative to compare the limited square wave with a reference square wave and then to produce an analogue voltage which is proportional to the phase difference, subsequent to which it is necessary to digitalize the signal in an analogue/digital converter. The signal produced on the output C of the last amplifier stage is applied to an input of a second A/D-converter AD2, in which the phase information of the signal is quantized to M bits and transmitted from the outputs of the A/D-converter to a second multiple of inputs on the digital signal processor MP. This processor may be of the type TMS 320 C 25 (Texas Instruments) or some corresponding processor. There can be used any microprocessor whatsoever which is capable of effecting the log-polar/cartesian transformation at a speed rapid enough for the application concerned, when this is the form required for further processing. The cartesian signal components are produced on the outputs of the microprocessor, as will be seen from FIG. 1. In the case of the arrangement illustrated in FIG. 1, it is necessary to limit the bandwidth of the amplifier chain, in order to prevent the generation of excessive noise. Consequently, propagation of the signal through the amplifier chain will be delayed, resulting in a continuous delay in the contribution from each of the detector steps. In order to prevent the introduction of disturbances in the case of rapid variations in signal amplitude, it may be necessary to correct for this relative delay prior to the summation of said values.

Figure 3:
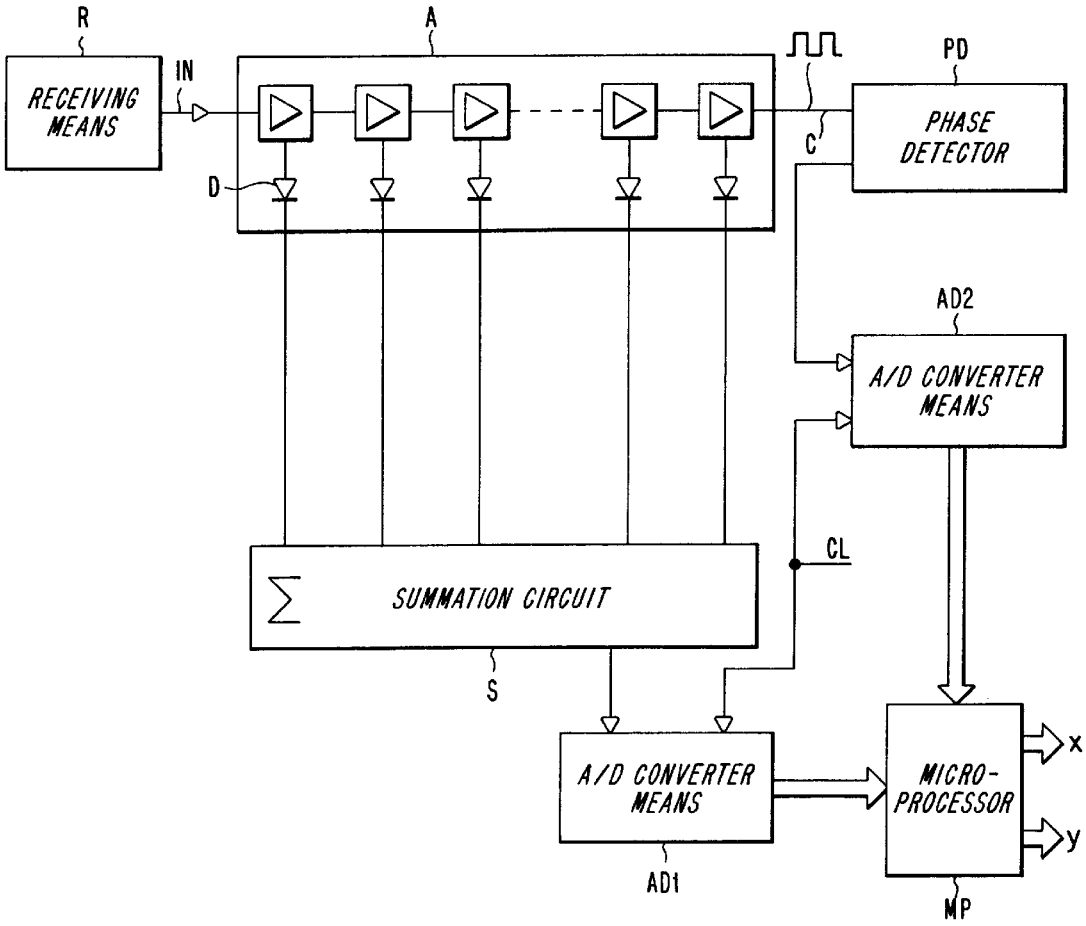
FIG. 3 is a schematic block diagram of the present invention having a phase detector.

The schematic block diagram of FIG. 3 is substantially similar to the schematic block diagram of FIG. 1, except that FIG. 3 includes a phase detector PD. The phase detector PD is preferably of the above-described type which compares the limited output square wave of the amplifier chain A with a reference square wave in order to produce an analog voltage which is proportional to the phase difference. The analog voltage is then applied to an analog to digital converter AD2 which digitizes the voltage.

Figure 2:
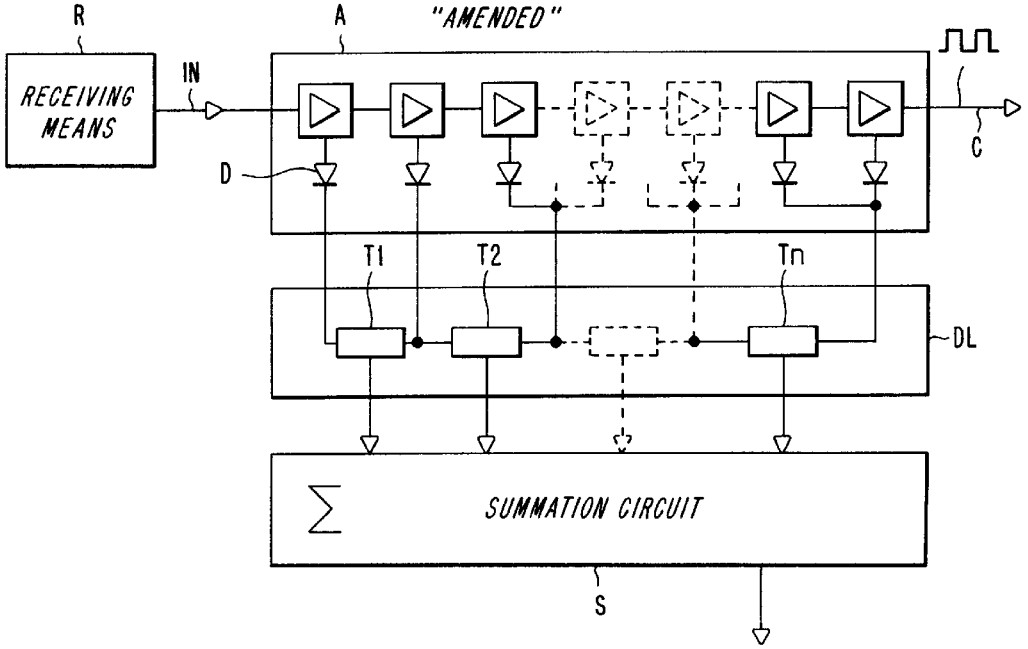
FIG. 2 is a simplified, schematic illustration of one variant of an amplifier chain according to FIG. 1.

Since an important feature of the inventive arrangement resides in the digitalizing of momentary envelope changes in the signal, the aforesaid relative delay may be compensated by including in the system a delay line DL with taps at given time distances. FIG. 2 shows such a delay line connected to the detector outputs of the amplifier chain. The taps T1–Tn can be adjusted automatically so as to compensate for the delay occuring in the amplifiers. The tap output signals are then summated and delivered to the first A/D-converter AD1. Examples of other compensation methods include the use of switched capacitors or some other CCD-technique (Charge Coupled Device). Alternatively, the output signals from each amplifier stage or groups of amplifying stages may be digitalized separately with the aid of sampling clock signals and the individual values then added together digitally. Timing of the synchronizing and sampling processes is effected in a known manner with the aid of system clock CL, indicated purely schematically in the drawing.

When applying known techniques, amplitude information is extracted very seldomly, and then only for the purpose of establishing the long-distribution quality of the signal and not with the intention of restore the vector characteristic of the signal, as is the intention with the inventive arrangement. As will be understood from the aforegoing, in order to achieve this it is necessary to digitalize the signal amplitude and phase angle synchronously at the same sampling rate, and to keep the values together in pairs for each sample, with the intention of restoring completely the instantaneous, composite vector sequency of the radio signal for use in the continued processing of the signal.

I claim:

1. A method for processing radio signals, that vary over a wide dynamic range, which comprises the steps of:

amplifying the radio signals in a plurality of serial stages;

detecting the output of each amplifying stage;

summing the detected outputs of each amplifying stage together to provide a signal proportional to the logarithm of the amplitudes of the radio signals;

generating signals proportional to the phase of the radio signals from the output of the last amplifying stage; and processing the signals proportional to the logarithm of the amplitudes and the signals proportional to the phase of the radio signals, in order to generate restored digital signals representative of the radio signals.

2. A method according to claim 1 which further includes the step of delaying the detected output of each amplifying stage prior to their summation.

3. A method according to claim 1 which further includes the step of clipping the output of the last amplifying stage such that the output at the last amplifying stage appears as a square wave.

4. An apparatus for processing radio signals that vary over a wide dynamic range, which comprises:

means for amplifying the radio signals in a plurality of serial stages;

means for detecting the output of each amplified stage;

means for summing the detected outputs of said detecting means in order to provide a signal proportional to the logarithm of the amplitudes of the radio signals;

means for generating signals proportional to the phase of the radio signals from the output of the last stage of said amplifying means; and processing means for processing the signals proportional to the logarithm of the amplitudes and the signals proportional to the phase of the radio signals, in order to provide restored digital signals representative of the radio signals.

5. An apparatus according to claim 4 which further includes means for clipping the output of the last amplifying stage such that the output of the last amplifying stage appears as a square wave.

6. An apparatus according to claim 4 which further includes an analog-to-digital converter for converting the signals proportional to the logarithm of the amplitudes to digital values.

7. An apparatus according to claim 6 which further includes an analog-to-digital converter for converting the signals proportional to the phase of the radio signals to digital values.

8. An apparatus according to claim 4 which further includes means for delaying the outputs of said detecting means prior to their application to said summing means.

9. An apparatus according to claim 8 which further includes an analog-to-digital converter for converting the signals proportional to the logarithm of the amplitudes to digital values.

10. An apparatus according to claim 9 which further includes an analog-to-digital converter for converting the signals proportional to the phase of the radio signals to digital values.

11. A method for processing radio signals, that vary over a wide dynamic range, which comprises the steps of:

amplifying the radio signals in a plurality of serial stages;

clipping the output of the last amplifying stage such that the output at the last amplifying stage appears as a square wave, detecting the output of each amplifying stage;

summing the detected outputs of each amplifying stage together to provide a signal proportional to the logarithm of the amplitudes of the radio signals;

generating signals proportional to the phase of the radio signals from the output of the last amplifying stage, such that the generation of signals proportional to the phase is synchronous with the signal proportional to the logarithm of the amplitudes; and processing the signals proportional to the logarithm of the amplitudes and the signals proportional to the phase of the radio signals, in order to generate restored digital signals representative of the radio signals.

*12. A method for processing complex radio signals that vary over a wide dynamic range, comprising the steps of:* amplifying the radio signals in a plurality of sequentially saturating stages to produce a hardlimited output signal from the final stage;

detecting the output from each stage and summing the detected outputs to produce a log-amplitude value approximately proportional to the logarithm of an instantaneous amplitude of the complex radio signals;

converting the hardlimited output signal from the final amplifier stage to numerical values related to the cosine of the instantaneous phase and to the sine of the phase; and processing the log-amplitude value and the cosine-related and sine-related values in order to produce numerical values representative of the real and imaginary parts of the complex radio signal.

*13. A method according to claim 12 in which the converting of the hardlimited output signal includes using an analog-to-digital converter.*

*14. A method according to claim 12 in which the cosine-related and the sine-related values are digital values.*

*15. A method according to claim 12 in which the log-amplitude value is generated as a digital value.*

*16. A method according to claim 12 in which the processing of the hardlimited output signal includes quadrature sampling.*

*17. An apparatus for processing a complex radio signal that varies over a wide dynamic range, which comprises:* means for amplifying the radio signal in a plurality of sequentially saturating stages and producing a hardlimited output signal from the final stage;

means for detecting the output from each stage and producing detected output signals;

means for converting the detected output signals to produce a log-amplitude value approximately proportional to the logarithm of an instantaneous amplitude of the complex radio signal;

means for converting the hardlimited output signal from the final stage in order to extract values containing instantaneous phase information such that the extracted values are produced substantially synchronously with the log-amplitude value; and processing means for processing the extracted values together with the log-amplitude value in order to provide digital values representative of the complex radio signal.

*18. An apparatus in accordance with claim 17 in which the extracted values are related to the cosine and to the sine respectively of the instantaneous phase of the radio signal.*

*19. An apparatus in accordance with claim 17 in which the processing means computes an antilogarithm of the log-amplitude value.*

*20. An apparatus in accordance with claim 18 in which the processing means computes an antilogarithm of the log-amplitude value and mathematically combines it with the cosine-related and sine-related values.*

*21. An apparatus for processing a complex radio signal that varies over a wide dynamic range, which comprises:* means for amplifying the radio signal in a plurality of sequentially saturating stages and producing a hardlimited output signal from the final stage;

means for detecting the output from each stage and producing detected output signals;

first means for converting the detected output signals to produce a first log-amplitude value approximately proportional to the logarithm of an instantaneous signal amplitude of the complex radio signal;

second means for converting the hardlimited output signal from the final stage in order to extract values containing instantaneous phase information; and processing means, responsive to said first and second converting means, for determining a second log-amplitude value representative of the instantaneous amplitude of the radio signal at the same instant the extracted values are representative of the instantaneous phase of the radio signal and for combining the determined second log-amplitude value with the extracted values in order to provide digital values representative of the complex radio signal.

*22. An apparatus in accordance with claim 21 in which the extracted values are related to the cosine and the sine respectively of the instantaneous phase of the radio signal.*

*23. An apparatus in accordance with claim 21 in which the processing means computes an antilogarithm of the log-amplitude signal.*

*24. An apparatus in accordance with claim 22 in which the processing means computes an antilogarithm of the log-amplitude value and multiplies it with the cosine-related and sine-related values.*

*25. A method of processing a radio signal comprising:* amplifying said radio signal using a chain of progressively saturating amplifiers each including detectors in order to produce detected signals related to the logarithm of the signal amplitude of the radio signal and a saturated output signal from the last amplifier in the chain of amplifiers that preserves preserving phase information of the radio signal;

sampling and digitizing said detected signal and said saturated output signal using analog-to-digital converters in order to produce corresponding numerical sample values; and numerically processing said numerical sample values in order to produce complex numerical samples representing said radio signal.

*26. A method according to claim 25 in which the complex numerical samples are produced in cartesian representations having a real and imaginary part.*

*27. A method according to claim 25 in which the complex numerical samples are produced in polar representations having a radius and angle.*

*28. A method according to claim 27 in which the complex numerical samples in polar representations are subjected to a polar to cartesian transformation.*

*29. An apparatus for processing a radio signal comprising:* receiving means for converting said radio signal to a suitable intermediate frequency signal;

amplifying and detecting means, having a plurality of stages, for amplifying the intermediate frequency signal to produce a detected signal related to the amplitude of the intermediate frequency signal and to produce a saturated output signal from the last stage of the amplifying and detecting means;

analog-to-digital converting means for sampling and digitizing the detected output signal and the saturated signal to produce corresponding numerical samples; and digital signal processing means to process the numerical samples in order to obtain complex numerical samples representative of the radio signal.

*30. An apparatus according to claim 29 in which the complex numerical samples are produced in cartesian representations having a real and imaginary part.*

*31. An apparatus according to claim 29 in which the complex numerical samples are produced in polar representations having a radius and angle.*

*32. An apparatus according to claim 31 in which the complex numerical samples in polar representations are subjected to a polar to cartesian transformation.*

* * * * *